United States Patent [19]
Pollmeier

[11] Patent Number: 5,546,043
[45] Date of Patent: Aug. 13, 1996

[54] CIRCUIT ARRANGEMENT FOR DRIVING AN MOS FIELD-EFFECT TRANSISTOR

[75] Inventor: Werner Pollmeier, Verl, Germany

[73] Assignee: Siemens Nixdorf Informationssysteme Aktiengesellschaft, Paderborn, Germany

[21] Appl. No.: 325,301
[22] PCT Filed: May 3, 1993
[86] PCT No.: PCT/DE93/00386
§ 371 Date: Nov. 7, 1994
§ 102(e) Date: Nov. 7, 1994
[87] PCT Pub. No.: WO93/22835
PCT Pub. Date: Nov. 11, 1993

[30] Foreign Application Priority Data

May 7, 1992 [DE] Germany ............. 42 15 042.6

[51] Int. Cl.$^6$ .................. H03K 17/687; H03K 17/60; H03K 3/00
[52] U.S. Cl. .................. 327/427; 327/483; 327/484; 327/108; 327/576
[58] Field of Search .................. 327/427, 430, 327/431, 432, 434, 482, 483, 484, 108, 109, 110, 576; 363/15, 16, 26; 323/289

[56] References Cited

U.S. PATENT DOCUMENTS

| | | | |
|---|---|---|---|
| 3,654,490 | 4/1972 | Kan | 327/484 |
| 4,859,927 | 8/1989 | Meijer | 323/289 |
| 4,940,906 | 7/1990 | Gulczynski | 327/108 |
| 5,352,932 | 10/1994 | Tihanyi | 327/427 |
| 5,371,418 | 12/1994 | Leipold et al. | 327/109 |
| 5,376,831 | 12/1994 | Chen | 327/427 |
| 5,397,878 | 5/1995 | Chen | 327/427 |
| 5,416,361 | 5/1995 | John et al. | 327/110 |

OTHER PUBLICATIONS

Japanese Abstract, T. Nagafune, "Driving Circuit for Field Effect Transistor", vol. 5 No. 181 (E–83) (853), Nov. 20, 1981, JP, A56–109037.
B. Roehr, "VMOS Transistors Interface ICs to High Power Loads", 8167 Computer Design, vol. 20 (1981) Nov., No. 11, Winchester, Mass, USA, pp. 233–240.

Primary Examiner—David C. Nelms
Assistant Examiner—Trong Phan
Attorney, Agent, or Firm—Hill, Steadman & Simpson

[57] ABSTRACT

In order to drive an MOS field-effect transistor as a voltage interrupter in a DC/DC converter operating on the chopper principle, a suitable circuit arrangement has an input transistor (T1) for current control on the input side with a low voltage change, a downstream phase reversing transistor (T2) and a complementary stage formed from a first and a second further transistor (T3, T4) whose collectors are interconnected. An auxiliary voltage is applied which is raised to the input voltage to be regulated. The complementary stage switches without any overlap by means of different current switching thresholds for the first further transistor (T3) and the phase reversing transistor (T2) which drives the second further transistor (T4). In addition, it switches with a switch-on delay, so that the switched-on duration of an upstream switched-mode regulator chip can be increased to 100%. The internal current consumption of the circuit arrangement is in this case low.

10 Claims, 2 Drawing Sheets

CIRCUIT ARRANGEMENT FOR DRIVING AN MOS FIELD-EFFECT TRANSISTOR

This application is a filing under U.S.C. 371 of PCT/DE93/00386.

BACKGROUND OF THE INVENTION

1. Field of the Invention

The invention relates to a circuit arrangement for driving an MOS field-effect transistor as a power switching element in a DC/DC voltage converter operating on the chopper principle, the source connection of the MOS field-effect transistor assuming a potential which differs as a function of its switching state.

2. Description of the Related Art

In present-day portable personal computers, electrical power is supplied to both the electronics and the disk drives via switched-mode regulators which are known per se. These regulators have a high efficiency. However, the forward-voltage loss of a switched-mode regulator having a bipolar switching stage is approximately 1 volt. In the case of a low input voltage of approximately +6 V and a desired output voltage of +5 V, these losses are relatively high. These losses can be greatly reduced by the use of an MOS field-effect transistor as a voltage interrupter with a low switched-on resistance.

A gate driver, for example, is required for driving low-resistance n-channel field-effect transistors, which gate driver produces gate-source voltages of $10 \text{ V} \leq U_{GS} \leq 20 \text{ V}$ ($\approx$field-effect transistor "On")

$-20 \text{ V} \leq U_{GS} \leq 2 \text{ V}$ ($\approx$ field-effect transistor "Off")

If it is intended to implement an input voltage range of $U_E=+5.5$ V to $+15$ V, the source voltage of the MOS field-effect transistor changes, as a result of it switching, for example from $U_S \approx -0.5$ V ($\approx$field-effect transistor "Off") to $U_S \approx +5.5$ V to $+15$ V ($\approx$field-effect transistor "On")

In the case of an input voltage of $U_E=+15$ V, the switched-on gate voltage is $U_{GSmin}+U_{Emax}=10$ V$+15$ V$=25$ V$\leq U_{Gon} \leq 35$ V$=20$ V$+15$ V$=U_{GSmax}+U_{Emax}$ In the case of an input voltage of $U_E=+5.5$ V, the switched-on gate voltage is $U_{GSmin}+U_{Emin}=10$ V$+5.5$ V$=15.5$ V$\leq U_{Gon} \leq 25.5$ V$=20$ V$+5.5$ V$=U_{Gmax}+U_{Emin}$ The gate control voltage for the selected input voltage range from $U_E=+5.5$ V to $15$ V must therefore lie between $U_{Gonmin}$ ($U_E=+15$ V)$=25$ V$\leq U_{Gon} \leq 25.5$ V$=U_{Gonmax}$ ($U_E=+5.5$ V)

The voltage of normal integrated gate drivers is limited to $U_{max}=20$ V and they have a disadvantageously high internal current consumption. This is a result of the fast charge reversal of internal capacitances with a large voltage change and steep edge gradient at the output. A steep edge gradient is important in order to keep the switching losses low in the MOS field-effect transistor.

A circuit arrangement for driving an MOS field-effect transistor within a DC/DC converter is disclosed, for example, in U.S. Pat. No. 4,859,927. This operates with a complementary transistor stage, via which the MOS field-effect transistor is driven. The complementary transistor stage is in this case connected on at least one side to a supply voltage. The base connections of the complementary transistors are connected to a control circuit which drives the complementary transistors as a function of a predetermined output voltage from the DC/DC voltage converter.

The document U.S. Pat. No. 3,654,490 discloses a further circuit arrangement for driving an MOS field-effect transistor having a pair of complementary transistors. In the case of this circuit arrangement, the bases of the complementary transistors are not directly connected to one another, but they are driven separately via in-phase control signals. In this case, a phase reversing transistor is assigned to one of the two complementary transistors.

As a rule, switched-mode regulator chips have a normal relative switched-on duration of 90%. However, a switched-on duration of 100% would be desirable. The phase reversing transistor mentioned above admittedly has a storage time by means of which the switched-on duration of the associated circuit arrangement can be influenced. However, no further measures are specified in order actually to ensure a 100% switched-on duration.

SUMMARY OF THE INVENTION

An object of the invention is thus to provide a circuit arrangement of the type mentioned initially, by means of which a 100% switched-on duration can be ensured.

This and other objects and advantages are achieved according to the invention by the circuit arrangement for driving an MOS field-effect transistor as a power switching element in a DC/DC voltage converter operating on the chopper principle, having a pair of complementary transistors formed from two further transistors whose bases are driven with in-phase control signals originating from an input transistor, and having a current limiter circuit, characterized in that the base of the first further transistor is connected to the collector of the input transistor, which collector is connected to means for setting a current switching threshold value for the first further transistor, and the base of the second further transistor is connected to the collector of a phase reversing transistor, which collector is connected to a supply voltage via matched means, in that the base of the phase reversing transistor is connected to the emitter of the input transistor, which emitter is connected to means for setting a current switching threshold value for the phase reversing transistor, and in that a capacitor is arranged between the base of the second further transistor and a reference potential of the circuit arrangement, for a switching-on delay of the second further transistor, which switching-on delay is additional to a switching-on delay which is governed by a storage time occurring in the phase reversing transistor.

A circuit arrangement constructed accordingly produces drive signals for an MOS field-effect transistor with a high edge gradient and a low internal current consumption. The low internal current consumption results from current coupling with a low voltage change, by means of which the various capacitances in the circuit arrangement need have their charges changed only relatively slightly. The voltage limiting circuit provided at the input to the circuit arrangement contributes to the low voltage change.

In addition, it is advantageous that the circuit arrangement operates with a constant control current, which is independent of the value of a first auxiliary voltage source.

The circuit arrangement has an effect which delays the switching-on time, as a result of which the maximum switched-on duration of a switched-mode regulator chip which is used, such as the Texas Instruments TL 494 or the Motorola MC 34 060 switched-mode regulator chip, for example, is increased. The switching-on delaying effect is produced by the switching-off delaying effect of a preceding stage transistor, which operates here as a phase reversing transistor. However, a capacitor which is connected to the base of the second further transistor contributes to a decisive increase in the switched-on duration, by means of which capacitor the switched-on delay of the circuit arrangement can additionally be increased to such an extent that the switched-on duration is 100%.

Advantageous refinements of the invention provided by a circuit arrangement as described above, characterized in that the means for setting the current switching threshold values of the first further transistor and of the phase reversing transistor are selected in such a manner that the current switching threshold value of the phase reversing transistor is lower than the current switching threshold value of the first further transistor. In a preferred embodiment, an output of the circuit arrangement is provided between the first and the second further transistor, to which output a high-value suppression resistor is connected, with a free connection side for connection to the source of the MOS field-effect transistor.

A series circuit comprising two diodes which are connected such that they face one another is arranged between the base and the collector of the first further transistor in such a manner that the connection of the base of the first further transistor to the collector of the input transistor is produced via one of the diodes.

A series circuit comprising two diodes which are connected pointing away from one another is arranged between the connection of the base of the second further transistor to the collector of the phase reversing transistor, in that the collector of the phase reversing transistor and the base of the second further transistor are connected via one of the diodes to the matched means via which a connection to the associated supply voltage is provided.

Preferably, a low-value current limiting resistor, assigned directly to the collector of the input transistor, is arranged in the collector path of the input transistor. Additionally, each of the two further transistors is formed by Darlington transistors.

A higher current switching threshold of the first further transistor with respect to the phase reversing transistor avoids simultaneous switching of the complementary transistors.

A zener diode represents a simple solution for the implementation of a voltage limiting circuit.

Darlington transistors are particularly suitable for high output currents.

A low-value current limiting resistor in the collector path of the input transistor improves the failure behavior of the circuit arrangement in operation with a defect.

A high-value suppression resistor at the output of the circuit arrangement, which resistor is connected in parallel with the gate-source path through the MOS field-effect transistor, increases the operating reliability of the circuit arrangement.

Desaturation diodes for the complementary stage transistors ensure that the complementary stage transistors switch on with low impedance and have a low saturation voltage.

BRIEF DESCRIPTION OF THE DRAWINGS

The invention is explained in more detail in the following text, with reference to a drawing, in which.

DETAILED DESCRIPTION OF THE PREFERRED EMBODIMENTS

Figure 1:
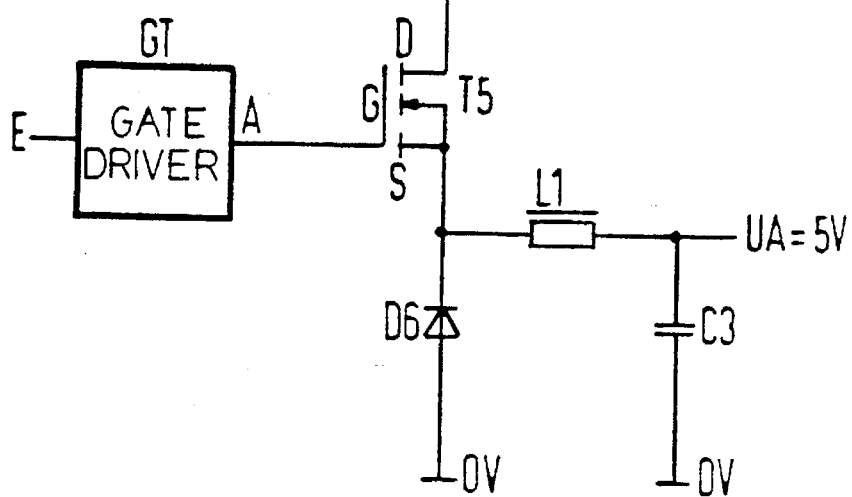
FIG. 1 is a circuit diagram showing an exemplary embodiment of the use of a circuit arrangement for driving an MOS field-effect transistor according to the prior art.

FIG. 1 shows a step-down switched-mode regulator which is known per se and comprises an MOS field-effect transistor T5 which acts as a voltage interrupter and has a gate G, a drain D and a source S, a freewheeling diode D6, a filter inductor L1 and a smoothing capacitor C3, which are interconnected in the manner illustrated. The MOS field-effect transistor T5, which acts as a voltage interrupter, is driven at the gate G of the MOS field-effect transistor T5 via a gate driver GT, which is likewise known per se and has a control input E and an output A. The exemplary embodiment shown here is related to a ground potential which is designated by 0 V. An input voltage UE having a value of 5.5 V to 15 V is connected to the drain D of the MOS field-effect transistor T5. The input voltage UE is regulated to an output voltage UA having a value of 5 V.

In the description of the following figures, the same reference symbols are in each case used for identical components irrespective of whether they have already been mentioned or not, and the description is also based on the same input voltage UE and the same output voltage UA.

Figure 2:
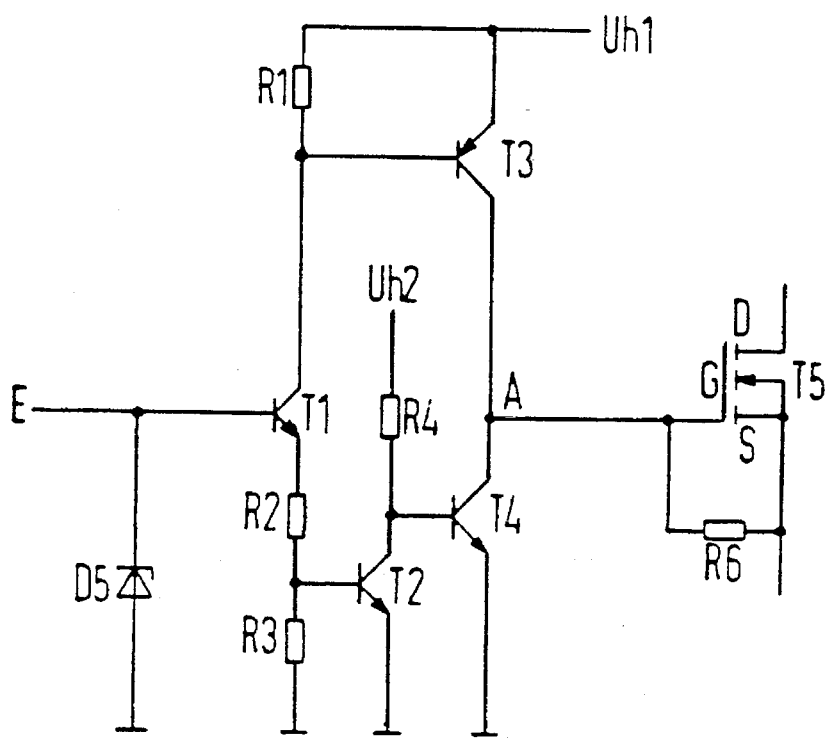
FIG. 2 shows a circuit arrangement for driving an MOS field-effect transistor according to the invention.
Figure 3:
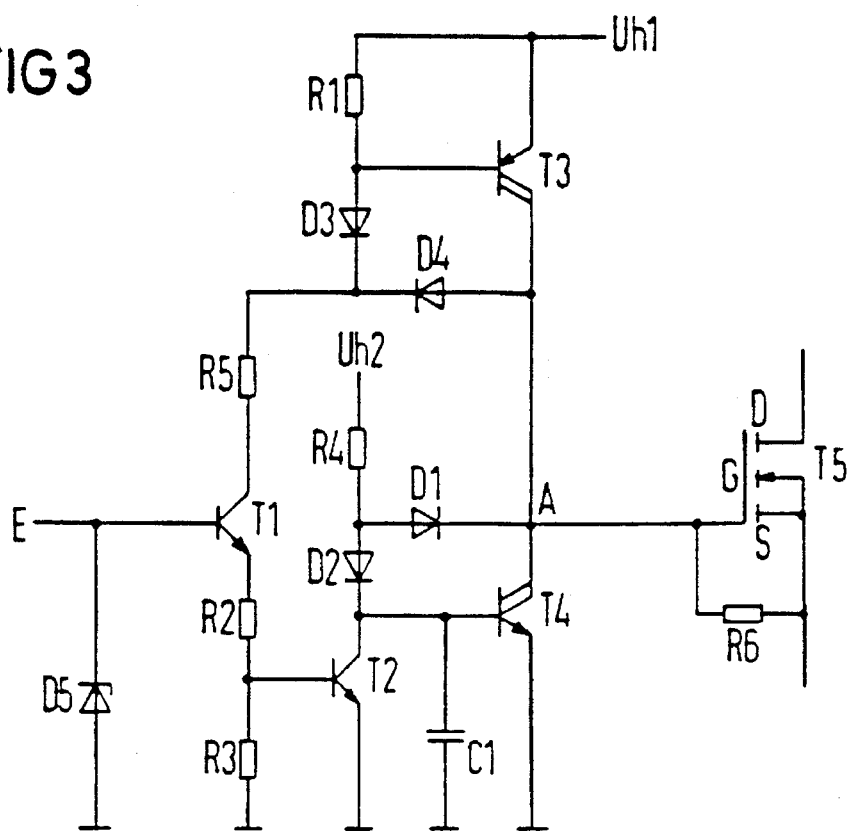
FIG. 3 shows an improved embodiment of a circuit arrangement according to FIG. 2.

The circuit arrangements in FIGS. 2 and 3 illustrate a gate driver GT as can be used in FIG. 1 and, later, in FIG. 4 as well. The circuit arrangement according to FIG. 3 in this case illustrates an embodiment which is an improvement on the circuit arrangement according to FIG. 2. Since, in principle, each of them is the same circuit arrangement, both circuit arrangements are described according to FIGS. 2 and 3 together.

Figure 4:
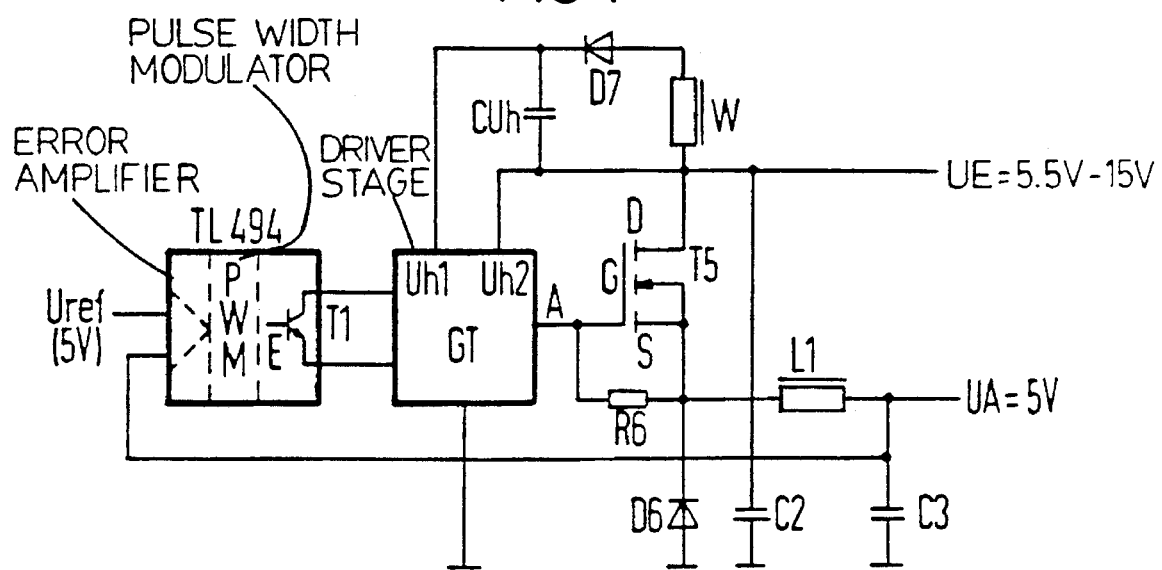
FIG. 4 shows an exemplary embodiment of the use of a circuit arrangement for driving an MOS field-effect transistor according to FIGS. 2 and 3.

The circuit arrangement has an input transistor T1 which is responsible for current coupling between an upstream switched-mode regulator chip, which is illustrated in more detail in FIG. 4, and the circuit arrangement. In this case, the output transistor of the upstream switched-mode regulator chip (FIG. 4) can also be used instead of the input transistor T1. Furthermore, the circuit arrangement has a phase reversing transistor T2 and a complementary stage formed from a first and a second further transistor T3, T4. The phase reversing transistor T2 is connected upstream of the second further transistor T4 of the complementary stage.

The two further transistors T3 and T4 switch on up to the saturation voltage. Darlington transistors (FIG. 3) are suitable for high output currents, instead of single-stage further transistors T3 and T4, respectively.

The base of the input transistor T1 forms the control input E of the circuit arrangement. A current limiting circuit D5, which is formed by a zener-diode connected in the reverse direction, is connected to the control input E of the circuit arrangement.

Located in the output circuit of the input transistor is a series circuit comprising a first, a second and a third resistor R1, R2, R3 of which the first resistor R1 is arranged on the collector side, and the second and the third resistor R2, R3 are arranged on the emitter side, of the input transistor T1.

The first resistor R1 has a free connection side to which a first auxiliary voltage source Uh1 is connected. The second resistor R2 is connected to the emitter of the input transistor T1. The third resistor R3 is arranged between the second resistor R2 and the ground potential of the circuit arrangement.

The base of the phase reversing transistor T2 is connected to a center connection between the second and third resistors R2, R3. The collector of the phase reversing transistor T2 is connected via a fourth resistor R4 to a second auxiliary voltage source Uh2.

The base of the first further transistor T3 is connected to the connection side opposite the free connection side of the first resistor R1, and the base of the second further transistor T4 is connected to the collector of the phase reversing transistor T2. The paths through the two further transistors T3, T4 are connected to one another and to the first auxiliary voltage source Uh1, the output A and the ground potential of the circuit arrangement in such a manner that the emitter of the first further transistor T3 is connected to the first auxiliary voltage source Uh1, the collector of the first further transistor T3 is connected to the output A of the circuit arrangement and at the same time to the collector of the second further transistor T4, and the emitter of the second further transistor T4 is connected to the ground potential of the circuit arrangement.

The drain of the MOS field-effect transistor T5 is connected to the output A of the circuit arrangement.

As FIG. 4 shows, the second auxiliary voltage source Uh2 supplies the input voltage UE, which is to be regulated, at a voltage level between 5.5 V and 15 V. As FIG. 4 likewise shows, the first auxiliary voltage source Uh1 supplies a voltage which is raised by a predetermined amount with respect to the voltage from the second auxiliary voltage source Uh2.

The input transistor T1, the phase reversing transistor T2 and the second further transistor T4 are formed by npn-transistors, and the first further transistor T3 is formed by a pnp-transistor.

According to FIG. 3, a low-value current limiting resistor R5, assigned directly to the collector of the input transistor T1, can be arranged in the collector path of the input transistor T1 and is used for current limiting in the event of a defect, for example in the event of a short circuit. Furthermore, a capacitor C1 (FIG. 3) can be connected to the base of the second further transistor T4, and a suppression resistor R6 (FIGS. 1 and 2) can be provided at the output A, with a free connection side for connection to the source S of the MOS field-effect transistor T5. In addition, desaturation diodes D1, D2, D3, D4—as illustrated in FIG. 3—can be used for the two further transistors T3, T4.

The first and the third resistors R1 and R3 determine the current switching thresholds of the first further transistor T3 and of the phase reversing transistor T2. The resistors are in this case to be selected in a manner such that the current switching threshold of the phase reversing transistor T2 is less than the current switching threshold of the first further transistor T3. The respective base-emitter diode threshold value is used as the voltage reference for the current switching thresholds.

The second resistor R2 and base voltage limiting, for example by the zener diode D5 on the input transistor T1, limit the control current at the input E of the circuit arrangement. In the upstream switched-mode regulator chip (FIG. 4), the base voltage limiting is carried out by the dedicated supply voltage with respect to a number of internal switching paths. The voltage limiting value at the base of the input transistor T1 should preferably be small in the sense of a small voltage change and the low capacitive charging currents associated with it.

The following description considers the individual switching phases of the circuit arrangement in more detail.

1. The MOS field-effect transistor T5 is "not conducting": the input transistor T1 is in this case switched off by a base voltage of approximately 0 V. In consequence, the phase reversing transistor T2 and the first further transistor T3 are also switched off. The second further transistor T4 is switched on via the fourth resistor R4.

2. The MOS field-effect transistor T5 is controlled to change from the off state to the on state:
the base of the input transistor T1 is initially controlled to be positive. The emitter of the input transistor T1 becomes positive and impresses a current in the first resistor R1 and in the third resistor R3. Beyond a current value of I=UBE, T2/R3 (UBE, T2: base-emitter voltage of T2), the phase reversing transistor T2 is switched on and switches the second further transistor T4 off. The first further transistor T3 is switched on beyond a higher current level of I=UBE, T3/R1 (UBE, T3: base-emitter voltage of T3). The current is limited by the voltage limiting via the zener diode D5 and the second resistor R2. As a result of the second further transistor T4 being highly oversaturated, it switches off slowly. The first further transistor T3 and the second further transistor T4 temporarily switch oppositely to one another. In order to avoid the power loss occurring as a result of this, the second further transistor T4 can be operated by means of the diode pair D1, D2 (FIG. 3) such that it is unsaturated.

3. The MOS field-effect transistor T5 is controlled to change from the on state to the off state:
the base of the input transistor T1 is controlled towards 0 V. In this case, the input transistor T1 continuously carries less current. The first further transistor T3 switches off first because of its high current switching threshold. After this, the phase reversing transistor T2 switches off, and the second further transistor T4 switches on.

In the event of a severe switching delay of the first further transistor T3 as a result of oversaturation, the first further transistor T3 and the second further transistor T4 can switch oppositely to one another. This is remedied by the desaturation diodes D3, D4 (FIG. 3). As a rule, these diodes are not required, since the phase reversing transistor T2 is severely oversaturated and has a sufficiently long storage time of approximately 3 μs. The first further transistor T3 is switched off, without any problems, via the first resistor R1 within this time.

The storage time which occurs in the phase reversing transistor T2 delays the switching-on of the second further transistor T4. The consequence is an extended switched-on time of the MOS field-effect transistor T5. This time is necessary in order to increase the relative switched-on duration, which is normal in switched-mode regulator chips, from 90% to 100%. In the case of a switching frequency of, for example, 50 kHz, the missing switched-on time corresponds to $$t=1/50 \text{ kHz} \times (100\%-90\%)/100\%=2 \text{ μs}.$$

The switching-on of the second further transistor T4 can additionally be delayed by the time constant R4×C1 by means of a capacitor C1 on the base of the second further transistor T4. The capacitor C1 is discharged in a low-impedance manner in the opposite direction, via the phase reversing transistor T2. Between the time at which the first further transistor T3 is switched "off" and the time at which the second further transistor T4 is switched "on", a high-impedance state is present at the output A of the circuit arrangement. However, this fact is not important since no gate current is flowing in the MOS field-effect transistor T5. An additional high-value suppression resistor R6 avoids any gate voltage building up on the MOS field-effect transistor T5 as a result of any possible collector residual current in the first further transistor T3 in the absence of any supply voltage Uh2 on the fourth resistor R4 (operation with a defect).

The time constant R6/CGS+CGD (CGS, CGD: capacitance of the gate-source path, gate-drain path of the MOS field-effect transistor T5) can be dimensioned such that it is not interfered with in the switching mode. For example, R6 may be 100 kOhm. In the case of a gate capacitance of CGS+CGD=5 nF, the time constant is $\tau$=500 µs. In the event of a gap in the time (time in which the two further transistors T3, T4 are simultaneously switched off) of t≈1 to 2 µs, the long time constant is not critical.

The voltage of the second auxiliary voltage source Uh2 on the fourth resistor R4 can be equal to the voltage level of the first auxiliary voltage source Uh1. However, because of the reduction in the power loss, a low voltage level for the second auxiliary voltage source Uh2 is advantageous.

FIG. 4 shows the production of an output voltage UA using an already described circuit arrangement. The power circuit of the circuit arrangement illustrated comprises the MOS field-effect transistor T5, the freewheeling diode D6, the filter inductor L1 and the smoothing capacitor C3. The MOS field-effect transistor T5 and the freewheeling diode D6 are bridged by a parallel capacitor C2, because of existing, disadvantageous input inductances. The forward voltage of the freewheeling diode D6 corresponds to the source voltage US of the MOS field-effect transistor T5 in its "OFF" state.

The already described circuit arrangement is connected upstream of the MOS field-effect transistor T5, as a driver stage GT. An error amplifier and a pulse-width modulator PWM with an output transistor are connected upstream of the input of the driver stage, the output transistor being used as the input transistor T1 of the driver stage GT. The Texas Instruments TL 494 switched-mode regulator chip is used for the error amplifier, the pulse-width modulator and the said output transistor. By interaction with the pulse-width modulator, the internal error amplifier uses a reference voltage Uref and the fed-back output voltage UA to determine the relative switched-on duration of the MOS field-effect transistor T5. The illustration does not show components which determine the frequency, limit the current and determine the voltage. They are described in the relevant applications of the IC manufacturer.

The voltage of the first auxiliary voltage source Uh1 is produced via the winding W of a separate voltage converter. It may be an element of additionally required voltages in the system.

The voltage of the separate voltage converter is raised to the voltage of the second auxiliary voltage source Uh2 and is supplied to the gate driver GT as the voltage of the first auxiliary voltage source Uh1, by means of circuit components comprising a diode D7 and a capacitor CUh, which are connected in the manner illustrated.

Although other modifications and changes may be suggested by those skilled in the art, it is the intention of the inventor to embody within the patent warranted hereon all changes and modifications as reasonably and properly come within the scope of his contribution to the art.

I claim:

1. A circuit arrangement connectable to a power supply for driving an MOS field-effect transistor as a power switching element in a DC/DC voltage converter operating on a chopper principle, comprising:

an input transistor;

a pair of complementary transistors formed of two further transistors whose bases are driven with in-phase control signals originating from said input transistor, a current limiter circuit, a base of a first of said further transistors connected to a collector of said input transistor, first means for setting a current switching threshold value for said first of said further transistors, said means for setting being connected to said collector of said input transistor;

a matched means;

a phase reversing transistor having a collector connected to a base of said second of said further transistor, said collector being connected to the supply voltage via said matched means, a base of said phase reversing transistor connected to an emitter of said input transistor, second means connected to said emitter of said input transistors for setting a current switching threshold value for said phase reversing transistor, and a capacitor arranged between said base of said second of said further transistors and a reference potential of the circuit arrangement for a switching-on delay of said second said further transistor, said switching-on delay being additional to a switching-on delay which is governed by a storage time occurring in said phase reversing transistor.

2. A circuit arrangement as claimed in claim 1, wherein said first means for setting the current switching threshold values of said first of said further transistors and said second means for setting the current switching threshold values of said phase reversing transistor are such that the current switching threshold value of said phase reversing transistor is lower than the current switching threshold value of said first of said further transistors.

3. A circuit arrangement as claimed in claim 1, further comprising:

an output of the circuit arrangement between said first and said second of said further transistors;

a high-value suppression resistor having one end connected to said output and having a second end for connection to a source of the MOS field-effect transistor.

4. A circuit arrangement as claimed in claim 1, further comprising:

a series circuit comprising two diodes which are connected such that said two diodes face one another, said series circuit being connected between the base and the collector of said first of said further transistors in such a manner that a connection of the base of said first of said further transistors to the collector of said input transistor is via one of said two diodes.

5. A circuit arrangement as claimed in claim 1, further comprising:

a series circuit comprising two diodes which are connected pointing away from one another is arranged between a connection of the base of said second of said further transistors to the collector of said phase reversing transistor, the collector of the phase reversing transistor and the base of the second further transistor are connected via one of said two diodes to said matched means via which a connection to the supply voltage is provided.

6. A circuit arrangement as claimed in claim 1, further comprising:

a low-value current limiting resistor connected directly to the collector of said input transistor.

7. A circuit arrangement as claimed in claim 1, wherein each of said two further transistors comprises Darlington transistors.

8. A circuit as claimed in claim 1, further comprising: a high-value suppression resistor at the output of the circuit arrangement, with a free connection side for connection to the source of the MOS field-effect transistor.

9. A circuit arrangement as claimed in claim 4, further comprising: a pair of desaturation diodes, which diodes act in parallel with the base-collector path of the first further transistor and connected in series with their cathodes facing one another, and of which the desaturation diode which is located closer to the collector path of the input transistor is arranged in this collector path with its direction towards the collector of the input transistor.

10. A circuit arrangement as claimed in claim 4, further comprising: a further pair of desaturation diodes is provided, which act in parallel with the base-collector path of the second further transistor and are connected in series with their cathodes facing away from one another, and of which the desaturation diode which is located closer to the collector path of the phase reversing transistor is arranged in this collector path with its direction towards the collector of the phase reversing transistor.

* * * * *